US012804895B2

(12) United States Patent
Hsu

(10) Patent No.: US 12,804,895 B2
(45) Date of Patent: Nov. 17, 2026

(54) FUSE-TYPE ONE TIME PROGRAMMING MEMORY CELL

(71) Applicant: eMemory Technology Inc., Hsin-Chu (TW)

(72) Inventor: Te-Hsun Hsu, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 1138 days.

(21) Appl. No.: 17/686,456

(22) Filed: Mar. 4, 2022

(65) Prior Publication Data

US 2023/0047939 A1 Feb. 16, 2023

Related U.S. Application Data

(60) Provisional application No. 63/232,668, filed on Aug. 13, 2021.

(51) Int. Cl.

| | |
|---|---|
| ***H10B 20/20*** | (2023.01) |
| ***G11C 7/24*** | (2006.01) |
| ***G11C 11/16*** | (2006.01) |
| ***G11C 13/00*** | (2006.01) |
| ***H10W 20/49*** | (2026.01) |

(52) U.S. Cl.

CPC ............... *H10B 20/20* (2023.02); *G11C 7/24* (2013.01); *G11C 11/1673* (2013.01); *G11C 11/1675* (2013.01); *G11C 11/1677* (2013.01); *G11C 13/003* (2013.01); *G11C 13/0038* (2013.01); *G11C 13/004* (2013.01); *G11C 13/0064* (2013.01); *H10W 20/493* (2026.01); *G11C 2013/0045* (2013.01); *G11C 2213/79* (2013.01)

(58) Field of Classification Search

None

See application file for complete search history.

(56) References Cited

U.S. PATENT DOCUMENTS 6,452,248 B1 * 9/2002 Le .......................... H10B 20/00 257/E23.149
8,174,091 B2 5/2012 Thei et al.
2005/0151205 A1 * 7/2005 Taniguchi .............. H10B 20/00 257/209
2009/0273055 A1 * 11/2009 Thei .................... H01L 23/5256 257/209
2012/0044739 A1 * 2/2012 Chung ................ G11C 11/1659 365/96

(Continued)

*Primary Examiner* — Yara B Green
*Assistant Examiner* — Akhee Sarker-Nag
(74) *Attorney, Agent, or Firm* — WPAT, PC

(57) ABSTRACT

A fuse-type one time programming memory cell includes a semiconductor substrate, a switch element, a first metal layer, a second metal layer and a third metal layer. Moreover, W metal lines are connected between a first metal area of the first metal layer and a first terminal of the switch element, and X metal lines are connected between a second metal area of the first metal layer and a second terminal of the switch element. Moreover, Y metal lines are connected between the second metal area of the first metal layer and a metal area of the second metal layer and served as a fuse element. Moreover, Z metal lines are connected between the metal area of the second metal layer and a metal area of the third metal layer. The total cross section area of the Y metal lines is the smallest.

9 Claims, 6 Drawing Sheets

(56) References Cited

U.S. PATENT DOCUMENTS

| | | | | |
|---|---|---|---|---|
| 2012/0314492 | A1* | 12/2012 | Shin | G11C 13/0059 365/163 |
| 2014/0016394 | A1* | 1/2014 | Chung | G11C 17/06 365/96 |
| 2017/0179131 | A1* | 6/2017 | Lin | H10D 89/10 |

* cited by examiner

FUSE-TYPE ONE TIME PROGRAMMING MEMORY CELL

This application claims the benefit of U.S. provisional application Ser. No. 63/232,668, filed Aug. 13, 2021, the subject matter of which is incorporated herein by reference.

FIELD OF THE INVENTION

The present invention relates to a non-volatile memory cell, and more particularly to a fuse-type one time programming memory cell and an associated cell array.

BACKGROUND OF THE INVENTION

As is well known, a non-volatile memory is able to continuously retain data after the supplied power is interrupted. Generally, after the non-volatile memory leaves the factory, the user may program the non-volatile memory in order to record data into the non-volatile memory.

According to the number of times the non-volatile memory is programmed, the non-volatile memories may be classified into a multi-time programming memory (also referred as a MTP memory), a one time programming memory (also referred as an OTP memory) and a mask read only memory (also referred as a Mask ROM).

Generally, the MTP memory can be programmed many times, and the stored data of the MTP memory can be modified many times. On the contrary, the OTP memory can be programmed once. After the OTP memory is programmed, the stored data fails to be modified. Moreover, after the Mask ROM leaves the factory, all stored data have been recorded therein. The user is only able to read the stored data from the Mask ROM, but is unable to program the Mask ROM.

Moreover, depending on the characteristics, the OTP memories may be classified into two types, i.e., a fuse-type OTP memory and an antifuse-type OTP memory. Before a memory cell of the fuse-type OTP memory is programmed, the memory cell has a low-resistance storage state. After the memory cell of the fuse-type OTP memory is programmed, the memory cell has a high-resistance storage state. On the other hand, the memory cell of the antifuse-type OTP memory has the high-resistance storage state before programmed, and the memory cell of the antifuse-type OTP memory has the low-resistance storage state after programmed.

FIG. 1A is a schematic cross-sectional view illustrating the structure of a conventional fuse-type OTP memory cell. FIG. 1B is a schematic equivalent circuit diagram of the conventional fuse-type OTP memory cell as shown in FIG. 1A. FIG. 10 is a schematic circuit diagram illustrating an OTP cell array with plural fuse-type OTP memory cells.

As shown in FIG. 1, two doped regions 120 and 130 are formed in a surface of a semiconductor substrate 110, and a gate structure is formed on the surface of the semiconductor substrate 110 and arranged between the two doped regions 120 and 130. The gate structure comprises a gate oxide layer 142 and a gate layer 140. The gate oxide layer 142 is formed on the surface of the semiconductor substrate 110 and covered by the gate layer 140. Moreover, a spacer 146 is arranged around the sidewall of the gate structure. That is, the spacer 146 is arranged around the sidewall of the gate layer 140 and the sidewall of the gate oxide layer 142. The semiconductor substrate 110, the two doped regions 120 and 130 and the gate structure are collaboratively formed as a switch transistor $M_s$. The semiconductor substrate 110 may be a well region in the semiconductor substrate, e.g., an n-well region or a p-well region. The switch transistor $M_s$ is an N-type transistor or a P-type transistor.

A metal layer is formed over the semiconductor substrate 110. The metal layer is divided into three separate metal areas 152, 154 and 156. The first metal area 152 is served as a source line SL. The second metal area 154 is served as a bit line BL. The third metal area 156 is served as a word line WL. Moreover, plural contact holes are arranged between the first metal area 152 and the first doped region 120, and a metallic material is filled into the contact holes. Consequently, plural metal lines 122 and 124 are formed. In other words, the metal lines 122 and 124 are connected between the first metal area 152 and the first doped region 120. Similarly, a metal line 132 is connected between the second metal area 154 and the second doped region 130, and a metal line 148 is connected between the third metal area 156 and the gate layer 140.

As shown in FIG. 1B, the fuse-type OTP memory cell 100 is a three-terminal device. The fuse-type OTP memory cell 100 comprises a switch transistor $M_S$ and a fuse element $R_F$. For example, the switch transistor $M_S$ is an N-type transistor. The first drain/source terminal of the switch transistor $M_S$ is a first terminal a of the fuse-type OTP memory cell 100, and connected with the source line SL. The gate terminal of the switch transistor $M_S$ is a control terminal c of the fuse-type OTP memory cell 100, and connected with the word line WL. The second drain/source terminal of the switch transistor $M_S$ is connected with the first terminal of the fuse element $R_F$. The second terminal of the fuse element $R_F$ is a second terminal b of the fuse-type OTP memory cell 100, and connected with the bit line BL.

Moreover, plural fuse-type OTP memory cells with the structure identical to the fuse-type OTP memory cell 100 of FIG. 1A can be collaboratively formed as an OTP cell array. As shown in FIG. 10, the OTP cell array 170 comprises 2×4 fuse-type OTP memory cells c11~c24. Each of the fuse-type OTP memory cells c11~c24 has the structure as shown in FIGS. 1A and 1B.

The fuse-type OTP memory cells c11~c14 in the first row of the OTP cell array 170 are connected with word lines WL1~WL4, source lines SL1~SL2 and a bit line BL1. The first terminal of the fuse-type OTP memory cell c11 is connected with the source line SL1. The control terminal of the fuse-type OTP memory cell c11 is connected with the word line WL1. The second terminal of the fuse-type OTP memory cell c11 is connected with the bit line BL1. The first terminal of the fuse-type OTP memory cell c12 is connected with the source line SL1. The control terminal of the fuse-type OTP memory cell c12 is connected with the word line WL2. The second terminal of the fuse-type OTP memory cell c12 is connected with the bit line BL1. The first terminal of the fuse-type OTP memory cell c13 is connected with the source line SL2. The control terminal of the fuse-type OTP memory cell c13 is connected with the word line WL3. The second terminal of the fuse-type OTP memory cell c13 is connected with the bit line BL1. The first terminal of the fuse-type OTP memory cell c14 is connected with the source line SL2. The control terminal of the fuse-type OTP memory cell c14 is connected with the word line WL4. The second terminal of the fuse-type OTP memory cell c14 is connected with the bit line BL1.

The fuse-type OTP memory cells c21~c24 in the second row of the OTP cell array 170 are connected with the word lines WL1~WL4, the source lines SL1~SL2 and a bit line BL2. The relationships between these memory cells are not redundantly described herein.

It is noted that the OTP cell array 170 is not restricted to the 2×4 cell array. That is, the OTP cell array may be an M×N cell array, wherein M and N are positive integers.

After the OTP cell array 170 is fabricated, all of the fuse-type OTP memory cells c11~c24 are in a low-resistance storage state. By providing proper bias voltages to the OTP cell array 170, a program operation and a read operation can be performed on any fuse-type OTP memory cell of the OTP cell array 170.

FIG. 2A schematically illustrates associated bias voltages for performing a program operation on the conventional fuse-type OTP memory cell. When the program operation is performed on the fuse-type OTP memory cell 100, a program voltage Vpp is provided to the source line SL, an on voltage Von is provided to the word line WL, and a ground voltage (0V) is provided to the bit line BL. The switch transistor $M_S$ is turned on, and a program current Ip is generated. The program current Ip flows from the source line SL to the bit line BL through the switch transistor $M_S$ and the fuse element $R_F$. For example, the program voltage Vpp is 3.3V, and the on voltage Von is 1.5V.

As shown in FIG. 2A, two metal lines 122 and 124 are connected between the source line SL and the first doped region 120. In addition, only a single metal line 132 is connected between the bit line BL and the second doped region 130, and served as the fuse element $R_F$. In case that the cross section areas of the metal lines 122, 124 and 132 are equal, the magnitude of the current flowing through the metal line 122 or 124 is smaller, and the magnitude of the current flowing through the metal line 132 is larger.

Consequently, when the program current Ip flows through the metal line 132, the current density on the metal line 132 is high enough to burn out the metal line 132. That is, the fuse element $R_F$ is burnt out. Under this circumstance, the region between the bit line BL and the second doped region 130 is in an open state corresponding to the high resistance. That is, after being programmed, the fuse-type OTP memory cell 100 is in the high-resistance storage state (e.g., in FIG. 2A). On the other hand, the fuse-type OTP memory cell 100 as shown in FIG. 1A is maintained in the low-resistance storage state because the fuse-type OTP memory cell 100 has not been programmed.

FIG. 2B schematically illustrates associated bias voltages for performing a read operation on the conventional fuse-type OTP memory cell in an unprogrammed state. FIG. 2C schematically illustrates associated bias voltages for performing a read operation on the conventional fuse-type OTP memory cell in a programmed state. When the read operation is performed on the fuse-type OTP memory cell 100, a read voltage Vr is provided to the source line SL, an on voltage Von is provided to the word line WL, and the ground voltage (0V) is provided to the bit line BL. For example, the read voltage Vr is 1.5V, and the on voltage Von is 0.7V.

As shown in FIG. 2B, the fuse-type OTP memory cell 100 is not programmed, and the metal line 132 is not burnt out. That is, the fuse element $R_F$ is connected between the second doped region 130 and the bit line BL. When the read operation is performed, the switch transistor $M_S$ is turned on, and a read current Ir is generated. The read current Ir flows from the source line SL to the bit line BL through the switch transistor $M_S$ and the fuse element $R_F$. Since the read current Ir is lower than the program current Ip, the fuse element $R_F$ is not burnt out during the read operation.

As shown in FIG. 2C, the fuse-type OTP memory cell 100 has been programmed. In addition, the metal line 132 has been burnt out. That is, the second doped region 130 and the bit line BL cannot be connected with each other through the fuse element $R_F$. When the read action is performed, the read current Ir is not generated. That is, the read current Ir is nearly zero.

In other words, the storage state of the fuse-type OTP memory cell 100 can be judged according to the magnitude of the read current Ir during the read operation. If the read current Ir is higher, it is determined that the fuse-type OTP memory cell 100 is in the low-resistance storage state. Whereas, if the read current Ir is nearly zero, it is determined that the fuse-type OTP memory cell 100 is in the high-resistance storage state.

However, due to the variation of the semiconductor manufacturing process, the conventional fuse-type OTP memory cell still has some drawbacks. For example, during the program operation, it is unable to predict the burnt position of the metal line 132 (i.e., the fuse element $R_F$). Consequently, the fuse-type OTP memory cell is possibly damaged, or the associated cell array possibly fails. The reasons will be described as follows.

FIG. 3 schematically illustrates the possible burnt positions of the fuse element in the conventional fuse-type OTP memory cell. As shown in FIG. 3, the metal line 132 has three possible burnt positions A, B and C after the program operation is completed. The position A is located at the lower region of the metal line 132 and close to the second doped region 130. The position B is located at a middle region of the metal line 132. The position C is located at the upper region of the metal line 132 and close to the second metal area 154. In a better situation, the position B of the metal line 132 is burnt out. Consequently, the fuse-type OTP memory cell 100 is programmed successfully, and the fuse-type OTP memory cell 100 is not damaged.

According to the standard semiconductor manufacturing process, the distance L between the gate structure of the switch transistor $M_S$ and the metal line 132 is approximately in the range between 0.05 μm and 0.15 μm. That is, the distance L between the gate structure of the switch transistor $M_S$ and the metal line 132 is very short. If the position A of the metal line 132 is burnt out after the program operation, the possibly of causing damage of the gate oxide layer 142 increases. Consequently, a large leakage current is generated in the region between the gate layer 140 and the semiconductor substrate 110. During the read operation, the word line WL generates a large leakage current, and the storage state of the fuse-type OTP memory cell 100 is erroneously judged.

For solving the above problems, the structure of the switch transistor $M_S$ is specially designed. For example, the distance L between the gate structure of the switch transistor $M_S$ and the metal line 132 is increased to be longer than 0.15 μm (e.g., 0.2 μm). Consequently, the drawbacks resulting from the burnt position A of the metal line 132 are effectively eliminated. However, the modification of the switch transistor $M_S$ may increase the size of the fuse-type OTP memory cell 100.

Please refer to FIG. 3 again. If the position C of the metal line 132 is burnt out after the program operation, the structure of the second metal area 154 is possibly destroyed or even the bit line BL is broken. If the bit line BL is broken, the row of fuse-type OTP memory cells of the OTP cell array corresponding to the broken bit line BL cannot be accessed.

SUMMARY OF THE INVENTION

An embodiment of the present invention provides a fuse-type one time programming memory cell. The fuse-type one time programming memory cell includes a semiconductor substrate, a switch element, a first metal layer, a second metal layer and a third metal layer. A first terminal of the switch element and a second terminal of the switch element are formed in the semiconductor substrate. The first metal layer is located over the semiconductor substrate. The first metal layer includes a first metal area and a second metal area. Moreover, W metal lines are connected between the first metal area of the first metal layer and the first terminal of the switch element, and X metal lines are connected between the second metal area of the first metal layer and the second terminal of the switch element. The second metal layer located over the first metal layer. The second metal layer includes a metal area. Moreover, Y metal lines are connected between the second metal area of the first metal layer and the metal area of the second metal layer, and the Y metal lines are served as a fuse element. The third metal layer is located over the second metal layer. The third metal layer includes a metal area. Moreover, Z metal lines are connected between the metal area of the second metal layer and the metal area of the third metal layer. A total cross section area of the Y metal lines is smaller than a total cross section area of the W metal lines, the total cross section area of the Y metal lines is smaller than a total cross section area of the X metal lines, and the total cross section area of the Y metal lines is smaller than to total cross section area of the Z metal lines, wherein W, X, Y and Z are positive integers.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 10 (prior art) is a schematic circuit diagram illustrating an OTP cell array with plural fuse-type OTP memory cells;

DETAILED DESCRIPTION OF PREFERRED EMBODIMENTS

In the standard semiconductor manufacturing process, plural metal layers are formed over the semiconductor substrate as the media for transferring power and signals. In accordance with the present invention, the fuse element is connected between two of the plural metal layers. Consequently, the fuse-type OTP memory cell can be programmed successfully. In addition, the problems of causing the damage of the fuse-type OTP memory cell or the failure of the OTP cell array can be avoided.

Figure 4:
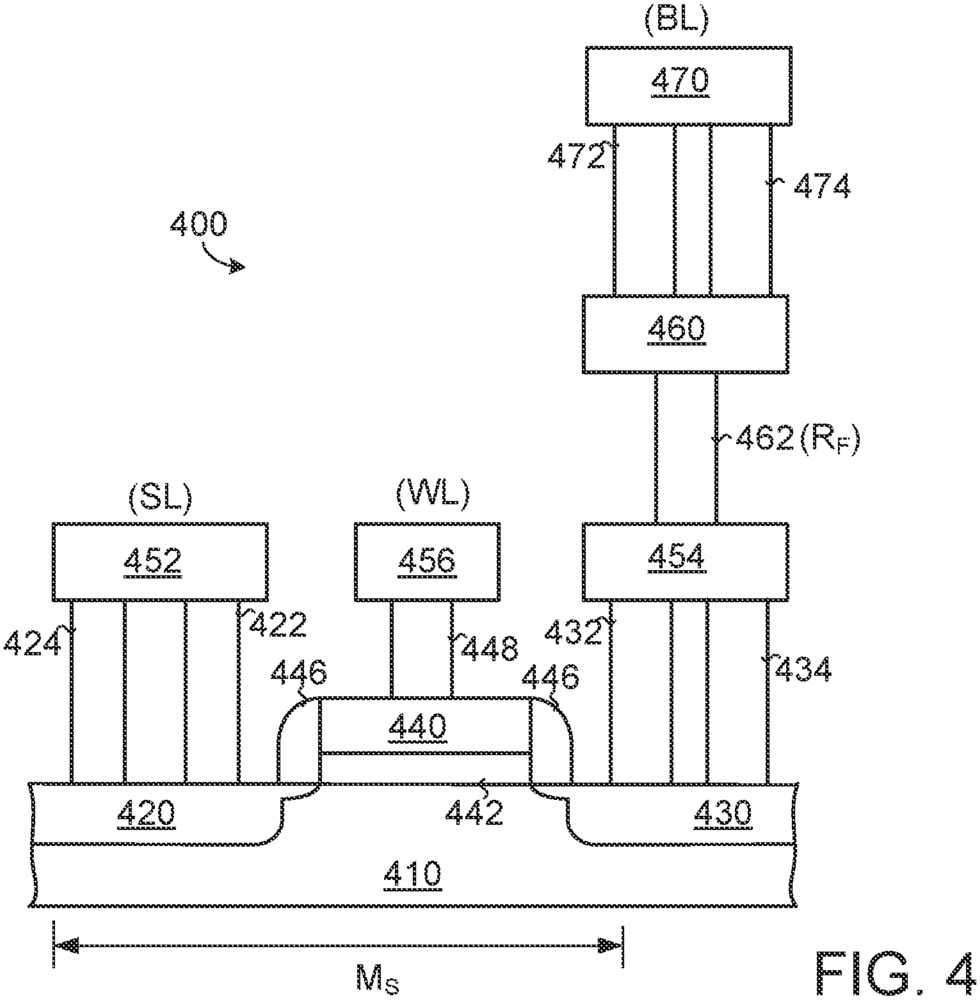
FIG. 4 is a schematic cross-sectional view illustrating the structure of a fuse-type OTP memory cell according to a first embodiment of the present invention.

FIG. 4 is a schematic cross-sectional view illustrating the structure of a fuse-type OTP memory cell according to a first embodiment of the present invention. As shown in FIG. 4, the fuse-type OTP memory cell 400 comprises a switch transistor $M_S$ and a fuse element $R_F$.

As shown in FIG. 4, two doped regions 420 and 430 are formed in a surface of a semiconductor substrate 410, and a gate structure is formed on the surface of the semiconductor substrate 410 and arranged between the two doped regions 420 and 430. The gate structure comprises a gate oxide layer 442 and a gate layer 440. The gate oxide layer 442 is formed on the surface of the semiconductor substrate 410 and covered by the gate layer 440. Moreover, a spacer 446 is arranged around the sidewall of the gate structure. That is, the spacer 446 is arranged around the sidewall of the gate layer 440 and the sidewall of the gate oxide layer 442. The semiconductor substrate 410, the two doped regions 420 and 430 and the gate structure are collaboratively formed as a switch transistor $M_s$. The semiconductor substrate 410 may be a well region of a semiconductor substrate, e.g., an n-well region or a p-well region. The switch transistor $M_s$ is an N-type transistor or a P-type transistor.

Moreover, plural metal layers are formed over the semiconductor substrate 410. In this embodiment, the plural metal layers include three metal layers.

The first metal layer is divided into three separate metal areas 452, 454 and 456. The first metal area 452 is served as a source line SL. The second metal area 454 is served as a first terminal of the fuse element $R_F$. The third metal area 456 is served as a word line WL.

Moreover, plural contact holes are arranged between the first metal area 452 and the first doped region 420, and a metallic material is filled into the contact holes. Consequently, plural metal lines 422 and 424 are formed. In other words, the metal lines 422 and 424 are connected between the first metal area 452 and the first doped region 420. Similarly, plural metal lines 432 and 434 are connected between the second metal area 454 and the second doped region 430, and a metal line 448 is connected between the third metal area 456 and the gate layer 440. In other words, the first drain/source terminal of the switch transistor $M_S$ is connected with the source line SL, the gate terminal of the switch transistor $M_S$ is connected with the word line WL, and the second drain/source terminal of the switch transistor $M_S$ is connected with the first terminal of the fuse element $R_F$.

The second metal layer is also located over the semiconductor substrate 410. Especially, the second metal layer is located over the first metal layer. The second metal layer comprises a metal area 460. The metal area 460 is served as the second terminal of the fuse element $R_F$. Moreover, a contact hole is arranged between the second metal area 454 of the first metal layer and the metal area 460 of the second metal layer, and a metallic material is filled into the contact hole. Consequently, a metal line 462 is formed. In other words, the metal line 462 is connected between the second metal area 454 of the first metal layer and the metal area 460 of the second metal layer. Moreover, the metal line 462 can be considered as a low-resistance fuse element $R_F$.

The third metal layer is also located over the semiconductor substrate 410. Especially, the third metal layer is located over the second metal layer. The third metal layer comprises a metal area 470. The metal area 470 is served as a bit line BL. Moreover, plural metal lines 472 and 474 are connected between the metal area 460 of the second metal layer and the metal area 470 of the third metal layer. In other words, the second terminal of the fuse element $R_F$ is connected with the bit line BL.

Figure 1A:
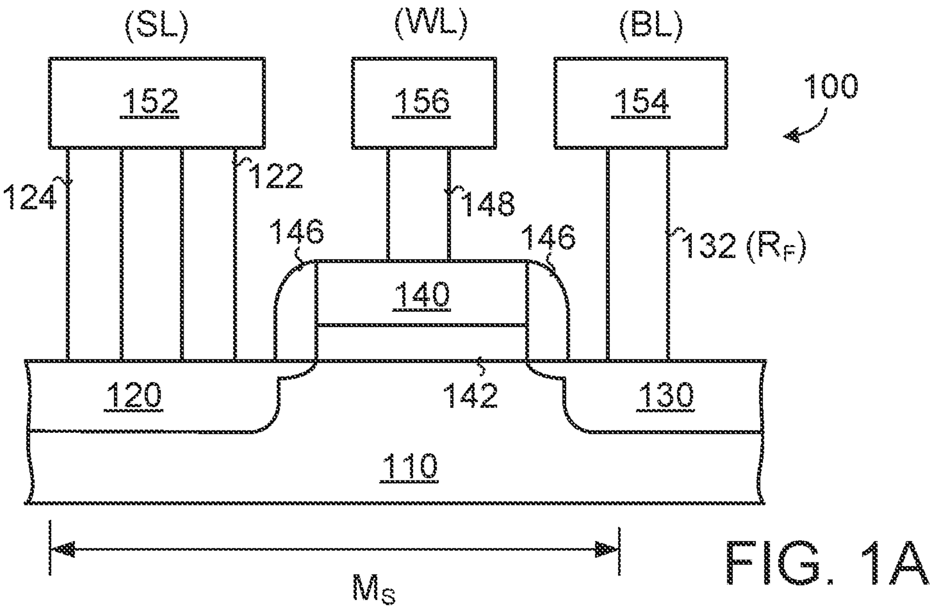
FIG. 1A (PRIOR ART)
FIG. 1A (prior art) is a schematic cross-sectional view illustrating the structure of a conventional fuse-type OTP memory cell.
Figure 1B:
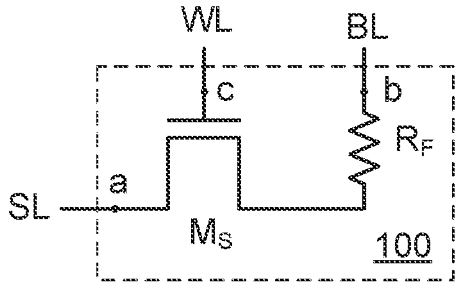
FIG. 1B (PRIOR ART)
FIG. 1B (prior art) is a schematic equivalent circuit diagram of the conventional fuse-type OTP memory cell as shown in FIG. 1A.
Figure 1C:
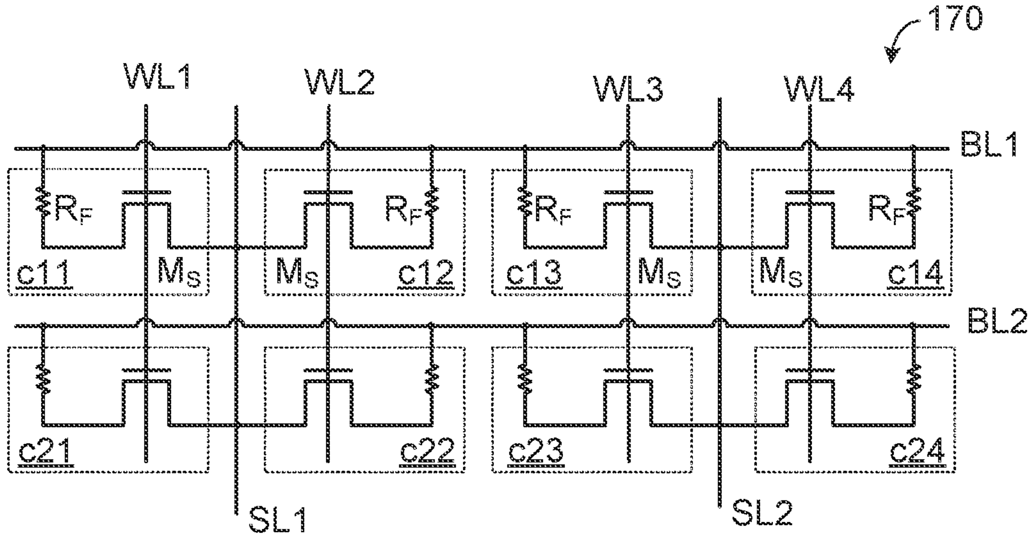
FIG. 1C (PRIOR ART)

The equivalent circuit of the fuse-type OTP memory cell 400 of this embodiment is identical to that of the fuse-type OTP memory cell 100 of FIG. 1B. The fuse-type OTP memory cell 400 is a three-terminal device. The first drain/source terminal of the switch transistor $M_S$ is served as a first terminal of the fuse-type OTP memory cell 400, and connected with the source line SL. The gate terminal of the switch transistor $M_S$ is served as a control terminal of the fuse-type OTP memory cell 400, and connected with the word line WL. The second terminal of the fuse element $R_F$ is served as a second terminal of the fuse-type OTP memory cell 400, and connected with the bit line BL. Similarly, plural fuse-type OTP memory cell 400 can be collaboratively formed as an OTP cell array.

Moreover, a current path of a program current Ip is formed between the source line SL and the bit line BL. In the current path of the program current Ip, the region between the second metal area 454 of the first metal layer and the metal area 460 of the second metal layer has the lowest number of metal lines. Take the fuse-type OTP memory cell 400 as an example. A single metal line 462 is connected between the second metal area 454 of the first metal layer and the metal area 460 of the second metal layer. Two metal lines 422 and 424 are connected between the first metal area 452 of the first metal layer and the first doped region 420. Two metal lines 432 and 434 are connected between the second metal area 454 of the first metal layer and the second doped region 430. Two metal lines 472 and 474 are connected between the metal area 460 of the second metal layer and the metal area 470 of the third metal layer.

Figure 5A:
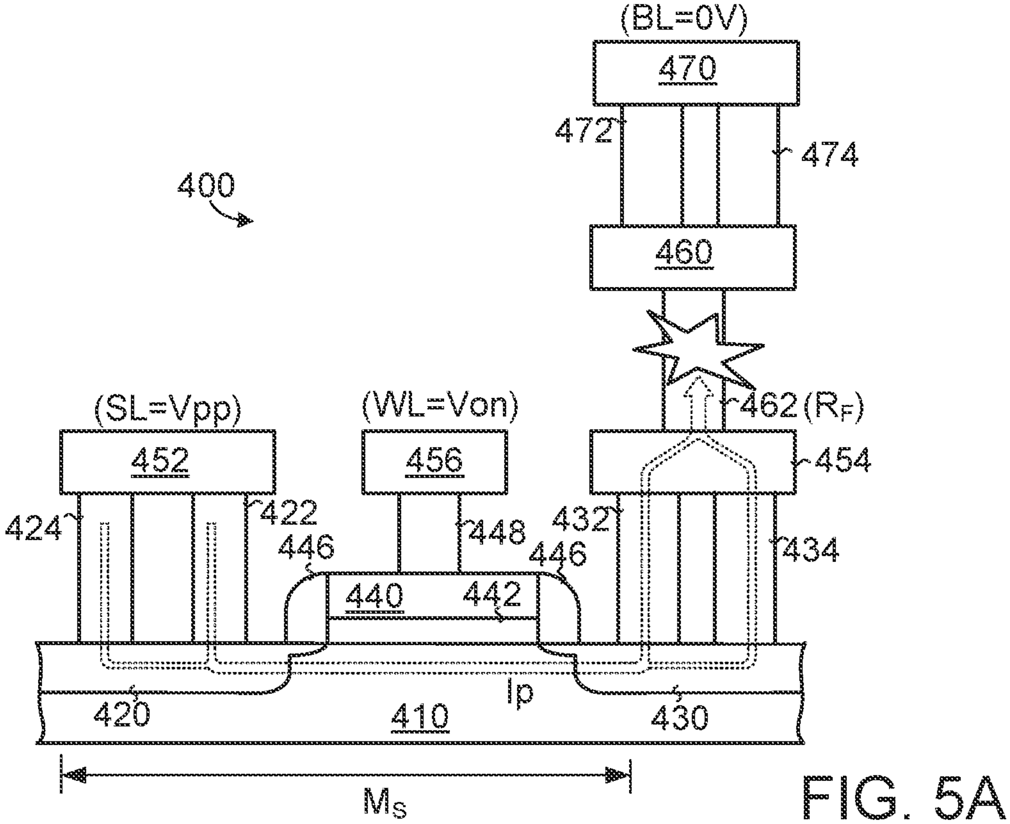
FIG. 5A schematically illustrates associated bias voltages for performing a program operation on the fuse-type OTP memory cell according to the first embodiment of the present invention.

FIG. 5A schematically illustrates associated bias voltages for performing a program operation on the fuse-type OTP memory cell according to the first embodiment of the present invention. When the program operation is performed on the fuse-type OTP memory cell 400, a program voltage Vpp is provided to the source line SL, an on voltage Von is provided to the word line WL, and a ground voltage (0V) is provided to the bit line BL. The switch transistor $M_S$ is turned on, and a program current Ip is generated. The program current Ip flows from the source line SL to the bit line BL through the switch transistor $M_S$ and the fuse element $R_F$. For example, the program voltage Vpp is 3.3V, and the on voltage Von is 1.5V.

As shown in FIG. 5A, the region between the second metal area 454 of the first metal layer and the metal area 460 of the second metal layer has the lowest number of metal lines (i.e., a single metal line 462), and the metal line 462 is served as the fuse element $R_F$. In case that the cross section areas of the metal lines 422, 424, 432, 434, 462, 472 and 474 are equal, the magnitude of the current flowing through the metal line 462 is the largest during the program operation.

Consequently, when the program current Ip flows through the metal line 462, the current density on the metal line 462 is the highest, so that the metal line 462 is burnt out. That is, the fuse element RF is burnt out. Under this circumstance, the region between the second metal area 454 of the first metal layer and the metal area 460 of the second metal layer is in an open state corresponding to the high resistance. That is, after being programmed, the fuse-type OTP memory cell 400 is in the high-resistance storage state (e.g., in FIG. 5A). On the other hand, the fuse-type OTP memory cell 100 as shown in FIG. 4 is maintained in the low-resistance storage state because the fuse-type OTP memory cell 400 has not been programmed.

Figure 2A:
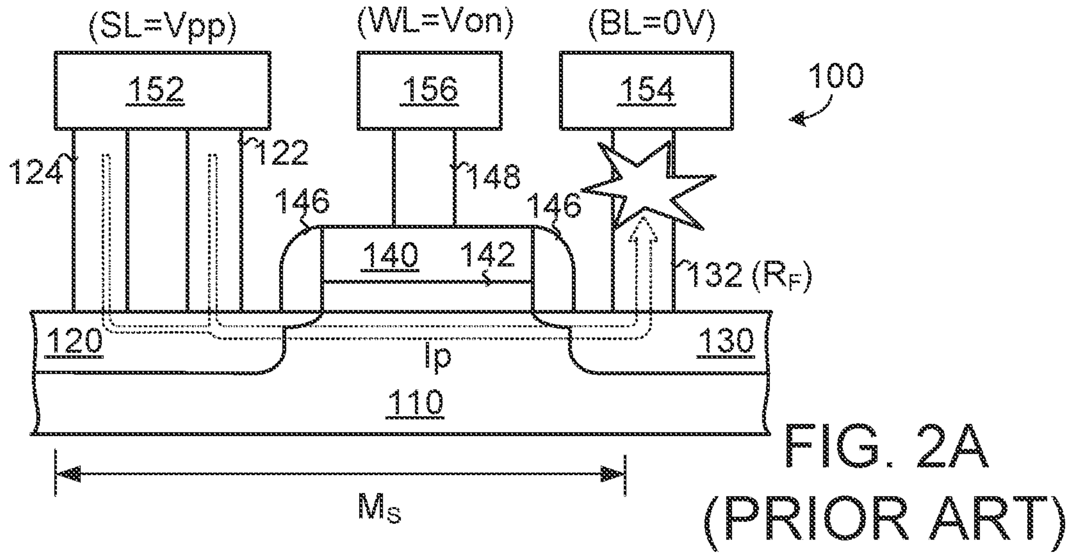
FIG. 2A (PRIOR ART)
FIG. 2A (prior art) schematically illustrates associated bias voltages for performing a program operation on the conventional fuse-type OTP memory cell.
Figure 2B:
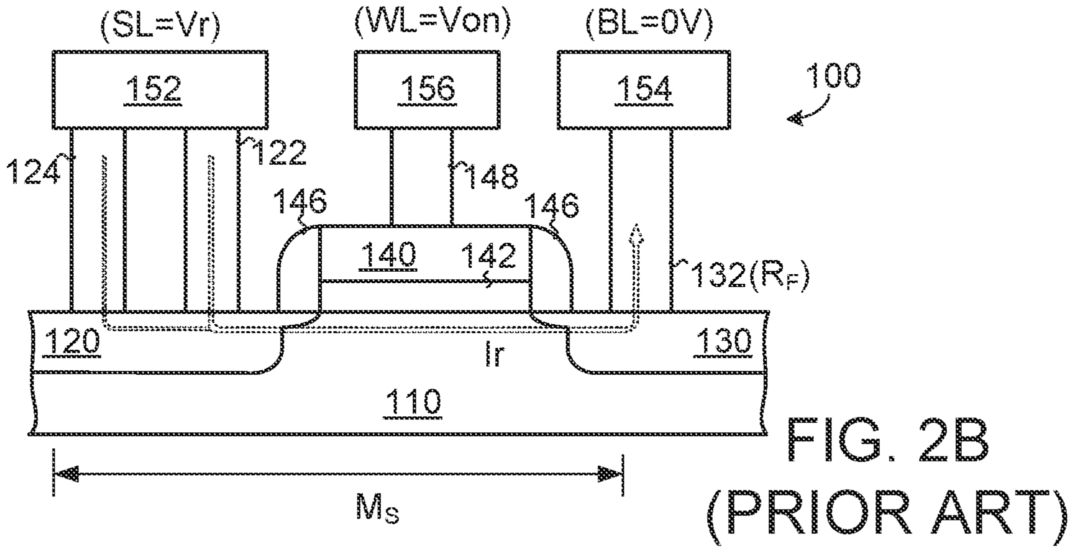
FIG. 2B (PRIOR ART)
FIG. 2B (prior art) schematically illustrates associated bias voltages for performing a read operation on the conventional fuse-type OTP memory cell in an unprogrammed state.
Figure 2C:
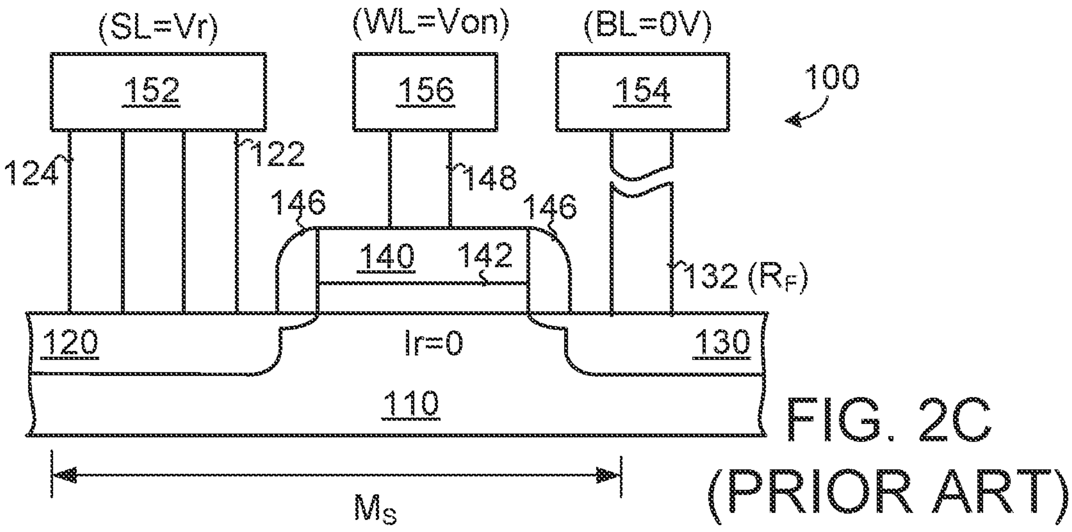
FIG. 2C (PRIOR ART)
FIG. 2C (prior art) schematically illustrates associated bias voltages for performing a read operation on the conventional fuse-type OTP memory cell in a programmed state.
Figure 3:
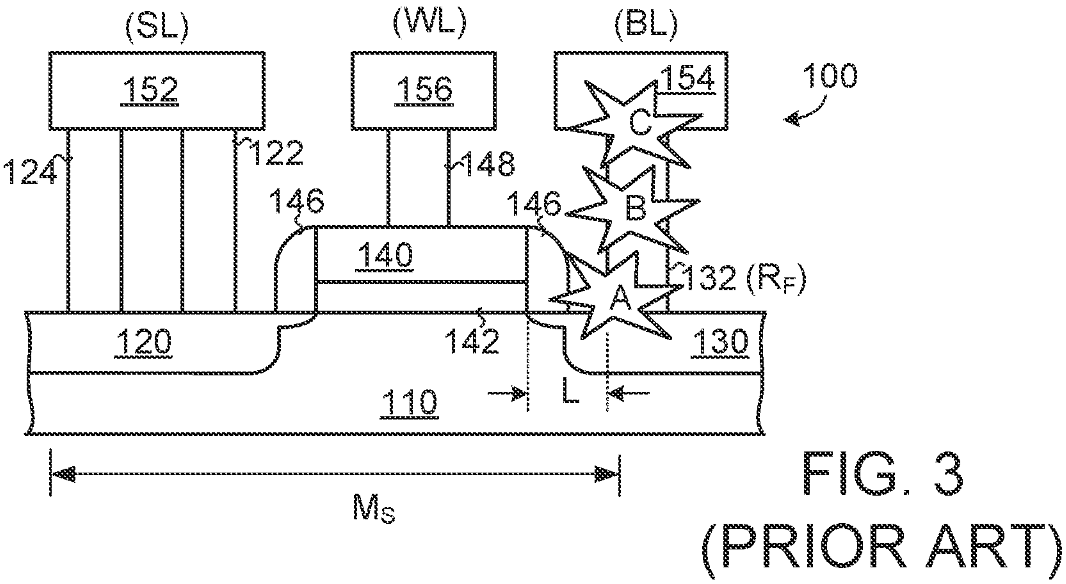
FIG. 3 (PRIOR ART)
FIG. 3 (prior art) schematically illustrates the possible burnt positions of the fuse element in the conventional fuse-type OTP memory cell.

By providing proper bias voltages as shown in FIGS. 2B and 2C, a read operation is performed on the fuse-type OTP memory cell 400. During the read operation, the storage state of the fuse-type OTP memory cell 400 can be judged according to the magnitude of the read current Ir. If the read current Ir is higher, it is determined that the fuse-type OTP memory cell 400 is in the low-resistance storage state. Whereas, if the read current Ir is nearly zero, it is determined that the fuse-type OTP memory cell 400 is in the high-resistance storage state.

Figure 5B:
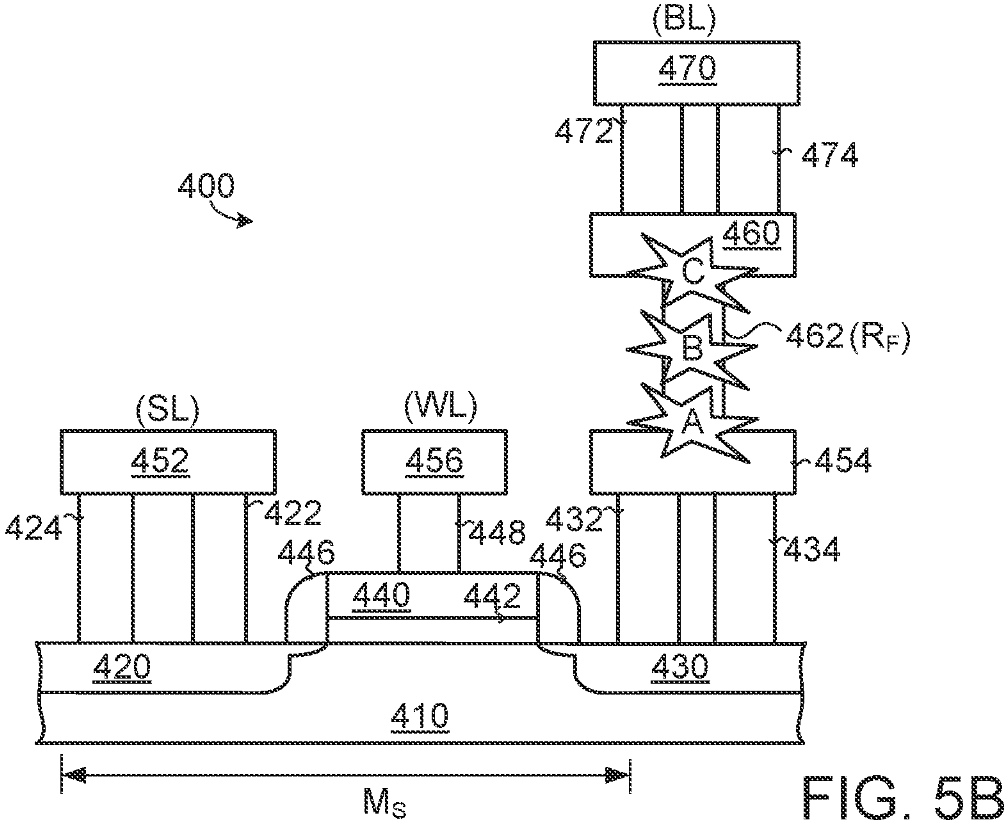
FIG. 5B schematically illustrates the possible burnt positions of the fuse element in the fuse-type OTP memory cell as shown in FIG. 5A.

FIG. 5B schematically illustrates the possible burnt positions of the fuse element in the fuse-type OTP memory cell as shown in FIG. 5A. As shown in FIG. 5B, the metal line 462 (i.e., the fuse element $R_F$.) is connected between the second metal area 454 of the first metal layer and the metal area 460 of the second metal layer. Consequently, the metal line 462 has three possible burnt positions A, B and C after the program operation is completed. The position A is located at the lower region of the metal line 462 close to the second metal area 454 of the first metal layer. The position B is located at a middle region of the metal line 462. The position C is located at the upper region of the metal line 462 and close to the metal area 460.

As shown in FIG. 5B, the position A of the metal line 462 is far away from the gate structure. Consequently, even if the position A of the metal line 462 is burnt out, the gate structure is not destroyed. Similarly, the position C of the metal line 462 is far away from the bit line BL. Consequently, even if the position C of the metal line 462 is burnt out, the bit line BL is not destroyed. That is, in case that any position of the metal line 462 is burnt out after the program operation, the problems of causing the damage of the fuse-type OTP memory cell 400 or the failure of the cell array will be avoided.

According to the specifications of the standard semiconductor manufacturing process, the withstanding current of the metal line in each contact hole should be lower than an upper limit (e.g., 30 μA). For preventing from the damage of the fuse element $R_F$ during the read operation, the fuse element $R_F$ is composed of plural metal lines.

Figure 6:
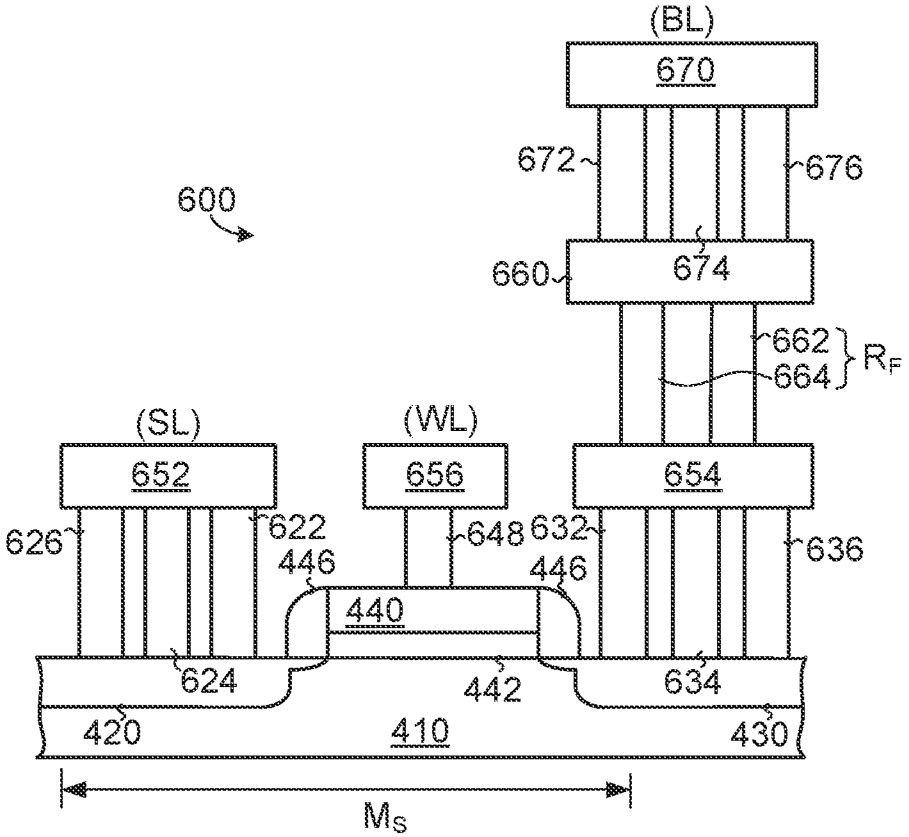
FIG. 6 is a schematic cross-sectional view illustrating the structure of a fuse-type OTP memory cell according to a second embodiment of the present invention.

FIG. 6 is a schematic cross-sectional view illustrating the structure of a fuse-type OTP memory cell according to a second embodiment of the present invention. As shown in FIG. 6, the fuse-type OTP memory cell 600 is also a three-terminal device. The fuse-type OTP memory cell 600 comprises a switch transistor $M_S$ and a fuse element $R_F$. In comparison with the fuse-type OTP memory cell 400 of the first embodiment, the number of metal lines in the fuse-type OTP memory cell 600 of this embodiment is distinguished. The structure of the switch transistor $M_S$ in the fuse-type OTP memory cell 600 is identical to the structure of switch transistor $M_S$ in the fuse-type OTP memory cell 400, and not redundantly described herein.

Similarly, plural metal layers are formed over the semiconductor substrate 410. In this embodiment, the plural metal layers include three metal layers.

The first metal layer is divided into three separate metal areas 652, 654 and 656. The first metal area 652 is served as a source line SL. The second metal area 654 is served as a first terminal of the fuse element $R_F$. The third metal area 656 is served as a word line WL.

Moreover, plural contact holes are arranged between the first metal area 652 and the first doped region 420, and a metallic material is filled into the contact holes. Consequently, plural metal lines 622, 624 and 626 are formed. In other words, the metal lines 622, 624 and 626 are connected between the first metal area 652 and the first doped region 420. Similarly, plural metal lines 632, 634 and 636 are connected between the second metal area 454 and the second doped region 430, and a metal line 648 is connected between the third metal area 656 and the gate layer 440.

The second metal layer is also located over the semiconductor substrate 410. Especially, the second metal layer is located over the first metal layer. The second metal layer comprises a metal area 660. The metal area 660 is served as the second terminal of the fuse element $R_F$. In this embodiment, plural metal lines 662 and 664 are connected between the second metal area 654 of the first metal layer and the metal area 660 of the second metal layer. Since the metal lines 662 and 664 are connected with each other in parallel, the parallel-connected metal lines 662 and 664 can be considered as a low-resistance fuse element $R_F$.

The third metal layer is also located over the semiconductor substrate 410. Especially, the third metal layer is located over the second metal layer. The third metal layer comprises a metal area 670. The metal area 670 is served as a bit line BL. Moreover, plural metal lines 672, 674 and 676 are connected between the metal area 660 of the second metal layer and the metal area 670 of the third metal layer.

Moreover, a current path of a program current is formed between the source line SL and the bit line BL. In the current path, the region between the second metal area 654 of the first metal layer and the metal area 660 of the second metal layer has the lowest number of metal lines (i.e., the metal lines 662 and 664). Take the fuse-type OTP memory cell 600 as an example. The two metal lines 662 and 664 are connected between the second metal area 654 of the first metal layer and the metal area 660 of the second metal layer. Three metal lines 622, 624 and 626 are connected between the first metal area 652 of the first metal layer and the first doped region 420. Three metal lines 632, 634 and 636 are connected between the second metal area 654 of the first metal layer and the second doped region 430. Three metal lines 672, 674 and 676 are connected between the metal area 660 of the second metal layer and the metal area 670 of the third metal layer.

In case that the cross section areas of the metal lines 622, 624, 626, 632, 634, 636, 662, 664, 672, 674 and 676 are equal, the magnitude of the current flowing through the metal lines 662 and 664 is the largest during the program operation. After the program operation is completed, the metal lines 662 and 664 are burnt out. That is, the fuse element RF is burnt out. Under this circumstance, the region between the second metal area 654 of the first metal layer and the metal area 660 of the second metal layer is in an open state corresponding to the high resistance.

Of course, the structure of the fuse-type OTP memory cell 600 may be modified. For example, in another embodiment, W metal lines are connected between the first metal area 652 of the first metal layer and the first doped region 420, X metal lines are connected between the second metal area 654 of the first metal layer and the second doped region 430, Y metal lines are connected between the second metal area 654 of the first metal layer and the metal area 660 of the second metal layer, and Z metal lines are connected between the metal area 660 of the second metal layer and the metal area 670 of the third metal layer. The cross section areas of all metal lines are equal. Moreover, Y is smaller than W, Y is smaller than X, and Y is smaller than Z, wherein W, X, Y and Z are positive integers.

It is noted that numerous modifications and alterations may be made while retaining the teachings of the invention. For example, in another embodiment, the cross section areas of these metal lines are different. Under this circumstance, W, X, Y and Z are arbitrary positive integers. However, the total cross section area of the Y metal lines is the smallest. That is, the total cross section area of the Y metal lines is smaller than the total cross section area of the W metal lines, the total cross section area of the Y metal lines is smaller than the total cross section area of the X metal lines, and the total cross section area of the Y metal lines is smaller than the total cross section area of the Z metal lines.

Figure 7A:
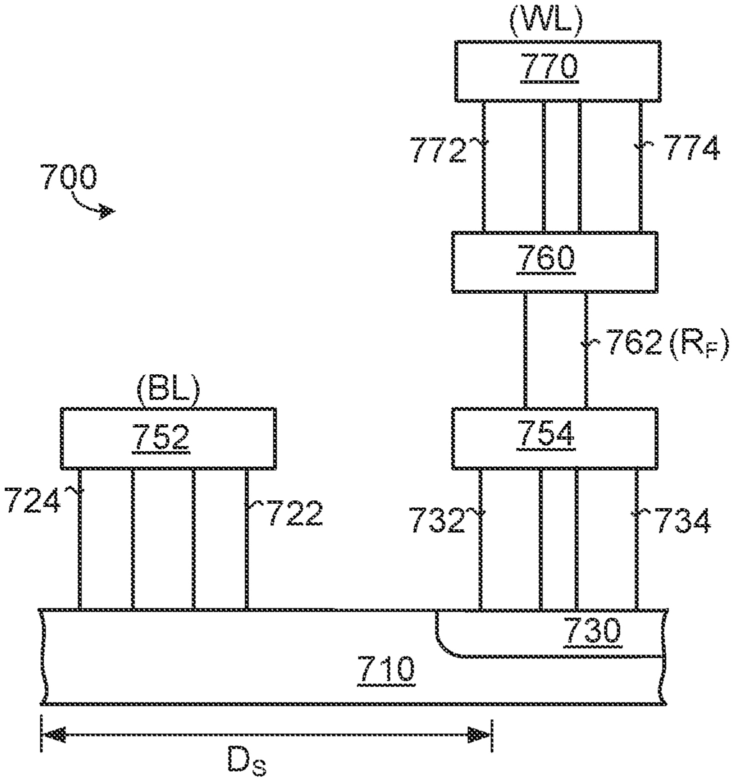
FIG. 7A is a schematic cross-sectional view illustrating the structure of a fuse-type OTP memory cell according to a third embodiment of the present invention.
Figure 7B:
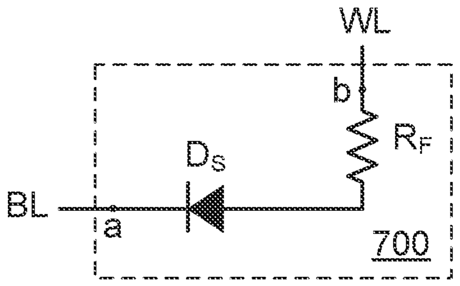
FIG. 7B is a schematic equivalent circuit diagram of the conventional fuse-type OTP memory cell as shown in FIG. 7A.
Figure 7C:
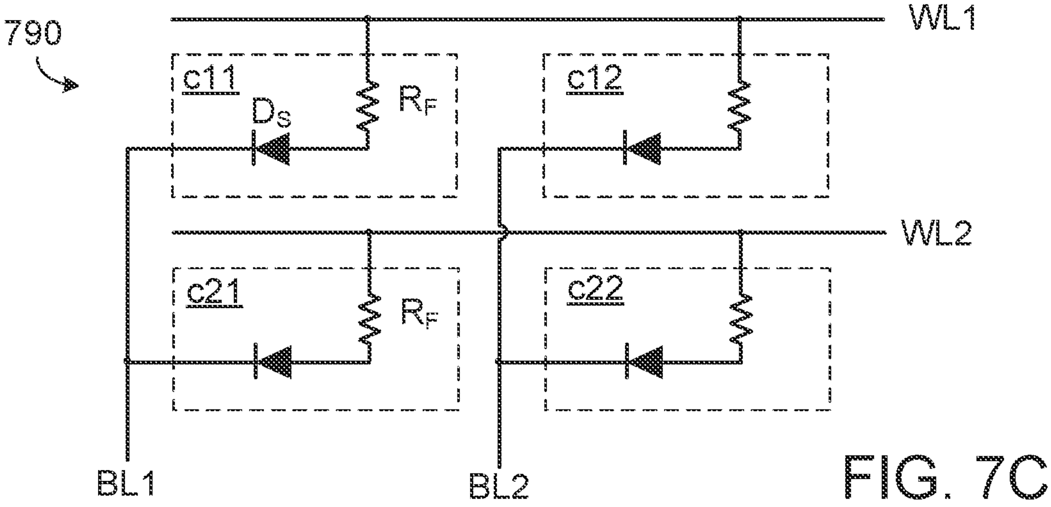
FIG. 7C is a schematic circuit diagram illustrating an OTP cell array with plural fuse-type OTP memory cells as shown in FIG. 7A.

In some other embodiments, the switch transistor of the fuse-type OTP memory cell is replaced by a switch diode. FIG. 7A is a schematic cross-sectional view illustrating the structure of a fuse-type OTP memory cell according to a third embodiment of the present invention. FIG. 7B is a schematic equivalent circuit diagram of the conventional fuse-type OTP memory cell as shown in FIG. 7A. FIG. 7C is a schematic circuit diagram illustrating an OTP cell array with plural fuse-type OTP memory cells as shown in FIG. 7A. In this embodiment, the fuse-type OTP memory cell 700 comprises a switch diode $D_S$ and a fuse element $R_F$.

A doped region 730 is formed in a surface of a semiconductor substrate 710. The semiconductor substrate 710 and the doped region 730 are made of different type semiconductor materials. For example, the doped region 730 is a P-type doped region, and the semiconductor substrate 710 is an N-type semiconductor substrate. That is, the switch diode $D_S$ is formed between the semiconductor substrate 710 and the doped region 730.

Moreover, plural metal layers are formed over the semiconductor substrate 710. In this embodiment, the plural metal layers include three metal layers.

The first metal layer is divided into two separate metal areas 752 and 754. The first metal area 752 is served as a bit line BL. The second metal area 754 is served as a first terminal of the fuse element $R_F$.

Moreover, plural contact holes are arranged between the first metal area 752 and the semiconductor substrate 710, and a metallic material is filled into the contact holes. Consequently, plural metal lines 722 and 724 are formed. In other words, the metal lines 722 and 724 are connected between the first metal area 752 and the semiconductor substrate 710. Similarly, plural metal lines 732 and 734 are connected between the second metal area 754 and the doped region 730. In other words, the first terminal of the switch diode $D_S$ is connected with the bit line BL, and the second terminal of the switch diode $D_S$ is connected with the first terminal of the fuse element $R_F$.

The second metal layer is also located over the semiconductor substrate 710. Especially, the second metal layer is located over the first metal layer. The second metal layer comprises a metal area 760. The metal area 760 is served as the second terminal of the fuse element $R_F$. Moreover, a contact hole is arranged between the second metal area 754 of the first metal layer and the metal area 760 of the second metal layer, and a metallic material is filled into the contact hole. Consequently, a metal line 762 is formed. In other words, the metal line 762 is connected between the second metal area 754 of the first metal layer and the metal area 760 of the second metal layer. Moreover, the metal line 762 can be considered as a low-resistance fuse element $R_F$.

The third metal layer is also located over the semiconductor substrate 710. Especially, the third metal layer is located over the second metal layer. The third metal layer comprises a metal area 770. The metal area 770 is served as a word line WL. Moreover, plural metal lines 772 and 774 are connected between the metal area 760 of the second metal layer and the metal area 770 of the third metal layer. In other words, the second terminal of the fuse element $R_F$ is connected with the word line WL.

Moreover, a current path of a program current is formed between the bit line BL and the word line WL. In the current path, the region between the second metal area 754 of the first metal layer and the metal area 760 of the second metal layer has the lowest number of metal lines (i.e., the metal line 762). In case that the cross section areas of the metal lines 722, 724, 732, 734, 762, 772 and 774 are equal, the magnitude of the current flowing through the metal line 762 is the largest during the program operation. After the program operation is completed, the metal line 762 is burnt out. That is, the fuse element RF is burnt out. Under this circumstance, the fuse-type OTP memory cell 700 is in the high-resistance storage state.

As shown in FIG. 7B, the fuse-type OTP memory cell 700 is a two-terminal device. The fuse-type OTP memory cell 700 comprises the switch diode $D_S$ and the fuse element $R_F$. The first terminal of the switch diode $D_S$ is served as a first terminal a of the fuse-type OTP memory cell 700, and connected with the bit line BL. The second terminal of the switch diode $D_S$ is served as a first terminal a of the fuse-type OTP memory cell 700, and connected with the first terminal of the fuse element $R_F$. The second terminal of the fuse element $R_F$ is served as a second terminal b of the fuse-type OTP memory cell 700, and connected with the word line WL.

Moreover, plural fuse-type OTP memory cells with the structure identical to the fuse-type OTP memory cell 700 of FIG. 7A can be collaboratively formed as an OTP cell array. As shown in FIG. 7C, the OTP cell array 790 comprises 2×2 fuse-type OTP memory cells c11~c22. Each of the fuse-type OTP memory cells c11~c22 has the structure as shown in FIGS. 7A and 7B.

The fuse-type OTP memory cells c11~c12 in the first row of the OTP cell array 790 are connected with a word line WL1 and bit lines BL1~BL2. The first terminal of the fuse-type OTP memory cell c11 is connected with the bit line BL1. The second terminal of the fuse-type OTP memory cell c11 is connected with the word line WL1. The first terminal of the fuse-type OTP memory cell c12 is connected with the bit line BL2. The second terminal of the fuse-type OTP memory cell c12 is connected with the word line WL1.

The fuse-type OTP memory cells c21~c22 in the first row of the OTP cell array 790 are connected with a word line WL2 and the bit lines BL1~BL2. The first terminal of the fuse-type OTP memory cell c21 is connected with the bit line BL1. The second terminal of the fuse-type OTP memory cell c21 is connected with the word line WL2. The first terminal of the fuse-type OTP memory cell c22 is connected with the bit line BL2. The second terminal of the fuse-type OTP memory cell c22 is connected with the word line WL2. It is noted that the OTP cell array 170 is not restricted to the 2×2 cell array. That is, the OTP cell array may be an M×N cell array, wherein M and N are positive integers.

After the OTP cell array 790 is fabricated, all of the fuse-type OTP memory cells c11~c22 are in a low-resistance storage state. By providing proper bias voltages to the OTP cell array 790, a program operation can be performed on any fuse-type OTP memory cell of the OTP cell array 790. Moreover, the programmed fuse-type OTP memory cell is changed to the high-resistance storage state.

Of course, the structure of the fuse-type OTP memory cell 700 may be modified. For example, in another embodiment, W metal lines are connected between the first metal area 752 of the first metal layer and the first semiconductor substrate 710, X metal lines are connected between the second metal area 754 of the first metal layer and the doped region 730, Y metal lines are connected between the second metal area 754 of the first metal layer and the metal area 760 of the second metal layer, and Z metal lines are connected between the metal area 760 of the second metal layer and the metal area 770 of the third metal layer. The cross section areas of all metal lines are equal. Moreover, Y is smaller than W, Y is smaller than X, and Y is smaller than Z, wherein W, X, Y and Z are positive integers.

It is noted that numerous modifications and alterations may be made while retaining the teachings of the invention. For example, in another embodiment, the cross section areas of these metal lines are different. Similarly, W metal lines are connected between the first metal area 752 of the first metal layer and the first semiconductor substrate 710, X metal lines are connected between the second metal area 754 of the first metal layer and the doped region 730, Y metal lines are connected between the second metal area 754 of the first metal layer and the metal area 760 of the second metal layer, and Z metal lines are connected between the metal area 760 of the second metal layer and the metal area 770 of the third metal layer. Under this circumstance, W, X, Y and Z are arbitrary positive integers. However, the total cross section area of the Y metal lines is the smallest. That is, the total cross section area of the Y metal lines is smaller than the total cross section area of the W metal lines, the total cross section area of the Y metal lines is smaller than the total cross section area of the X metal lines, and the total cross section area of the Y metal lines is smaller than the total cross section area of the Z metal lines.

From the above descriptions, the present invention provides a fuse-type OTP memory cell. The fuse-type OTP memory cell comprises a switch element and a fuse element. The switch element is a switch transistor or a switch diode. In the fuse-type OTP memory cell, the fuse element is arranged between two metal layers over the semiconductor substrate. Consequently, the fuse-type OTP memory cell can be programmed successfully, and the fuse-type OTP memory cell will not be damaged. Moreover, in the current path of the program current Ip, the fuse element has the lowest number of metal lines, or the fuse element has the smallest cross section area. Consequently, after the program operation is completed, the fuse element is burnt out but the metal lines other than the fuse element is not damaged.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A fuse-type one time programming memory cell, comprising:

a semiconductor substrate;

a switch element, wherein a first terminal of the switch element and a second terminal of the switch element are formed in the semiconductor substrate;

a first metal layer located over the semiconductor substrate, wherein the first metal layer comprises a first metal area and a second metal area, wherein W metal lines are connected between the first metal area of the first metal layer and the first terminal of the switch element, and X metal lines are connected between the second metal area of the first metal layer and the second terminal of the switch element;

a second metal layer located over the first metal layer, wherein the second metal layer comprises a metal area, wherein Y metal lines are connected between the second metal area of the first metal layer and the metal area of the second metal layer, and the Y metal lines are served as a fuse element; and a third metal layer located over the second metal layer, wherein the third metal layer comprises a metal area, wherein Z metal lines are connected between the metal area of the second metal layer and the metal area of the third metal layer, wherein a total cross section area of the Y metal lines is the smallest among W,X, Y and Z metal lines, the total cross section of the Y metal lines is smaller than a total cross section area of the W metal lines, the total cross section area of the Y metal lines is smaller than a total cross section area of the X metal lines, and the total cross section area of the Y metal lines is smaller than a total cross section area of the Z metal lines, wherein W, X, Y and Z are positive integers;

wherein after a program operation is completed, the fuse element consisting of the Y metal lines with the smallest total cross section area is burnt out.

2. The fuse-type one time programming memory cell as claimed in claim 1, wherein cross section areas of the W metal lines, the X metal lines, the Y metal lines and the Z metal lines are equal, wherein Y is smaller than W, Y is smaller than X, and Y is smaller than Z.

3. The fuse-type one time programming memory cell as claimed in claim 1, wherein the semiconductor substrate further comprises a doped region, wherein the semiconductor substrate is served as the first terminal of the switch element, the doped region is served as the second terminal of the switch element, and the switch element is a switch diode.

4. The fuse-type one time programming memory cell as claimed in claim 3, wherein the first metal area of the first metal layer is served as a bit line, the second metal area of the first metal layer is served as a first terminal of the fuse element, the metal area of the second metal layer is served as a second terminal of the fuse element, and the metal area of the second metal layer is served as a word line.

5. The fuse-type one time programming memory cell as claimed in claim 3, wherein a first terminal of the switch diode is connected with a bit line, a second terminal of the switch diode is connected with a first terminal of the fuse element, and a second terminal of the fuse element is connected with a word line.

6. The fuse-type one time programming memory cell as claimed in claim 1, wherein the fuse-type one time programming memory cell further comprises a first doped region, a second doped region and a gate structure, wherein the first doped region and second doped region are formed in a surface of the semiconductor substrate, and the gate structure is formed on the surface of the semiconductor substrate and arranged between the first doped region and second doped region, wherein a gate oxide layer of the gate structure is contacted with the surface of the semiconductor substrate, and the gate oxide layer is covered by a gate layer of the gate structure, wherein the first doped region is served as the first terminal of the switch element, the second doped region is served as the second terminal of the switch element, and the switch is a switch transistor.

7. The fuse-type one time programming memory cell as claimed in claim 6, wherein first metal layer further comprises a third metal area, wherein the first metal area of the first metal layer is served as a source line, the second metal area of the first metal layer is served as a first terminal of the fuse element, and the third metal area of the first metal layer is served as a word line.

8. The fuse-type one time programming memory cell as claimed in claim 7, wherein the metal area of the second metal layer is served as a second terminal of the fuse element, and the metal area of the third metal layer is served as a bit line.

9. The fuse-type one time programming memory cell as claimed in claim 6, wherein a first drain/source terminal of the switch transistor is connected with a source line, a gate terminal of the switch transistor is connected with a word line, a second drain/source terminal of the switch transistor is connected with a first terminal of the fuse element, and a second terminal of the fuse element is connected with a bit line.

* * * * *